US009140761B2

United States Patent
Ishishita (10) Patent No.: US 9,140,761 B2
(45) Date of Patent: Sep. 22, 2015

(54) BATTERY PACK FAILURE DETECTION DEVICE

(75) Inventor: Teruo Ishishita, Miyoshi (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 452 days.

(21) Appl. No.: 13/517,341

(22) PCT Filed: Dec. 25, 2009

(86) PCT No.: PCT/JP2009/071538
§ 371 (c)(1),
(2), (4) Date: Jun. 20, 2012

(87) PCT Pub. No.: WO2011/077540
PCT Pub. Date: Jun. 30, 2011

(65) Prior Publication Data
US 2012/0262180 A1    Oct. 18, 2012

(51) Int. Cl.
*G01R 31/36*    (2006.01)
*G01R 19/165*    (2006.01)

(52) U.S. Cl.
CPC ...... *G01R 31/3658* (2013.01); *G01R 19/16542* (2013.01); *G01R 31/3624* (2013.01); *G01R 31/3662* (2013.01)

(58) Field of Classification Search
CPC ............... G01R 19/16542; G01R 31/3624; G01R 31/36; B60L 3/0046
USPC .............. 324/430, 434; 320/120, 116; 702/63
See application file for complete search history.

(56) References Cited

U.S. PATENT DOCUMENTS

| | | | |
|---|---|---|---|
| 6,486,637 B1 * | 11/2002 | Nakanishi et al. | 320/150 |
| 8,463,562 B2 * | 6/2013 | Nakanishi | 702/63 |
| 2007/0001680 A1 * | 1/2007 | Khoo | 324/430 |
| 2008/0143543 A1 | 6/2008 | Vandensande et al. | |
| 2010/0065349 A1 * | 3/2010 | Ichikawa et al. | 180/65.1 |
| 2012/0242344 A1 | 9/2012 | Ishishita | |

FOREIGN PATENT DOCUMENTS

| | | |
|---|---|---|
| CN | 1305240 A | 7/2001 |
| CN | 101202463 A | 6/2008 |
| CN | 102656048 A | 9/2012 |

(Continued)

OTHER PUBLICATIONS

International Search Report mailed Apr. 6, 2010 of PCT/JP2009/071538.

*Primary Examiner* — Arleen M Vazquez
*Assistant Examiner* — Brent J Andrews
(74) *Attorney, Agent, or Firm* — Kenyon & Kenyon LLP (57) ABSTRACT

Each detection unit is configured to compare a voltage output from a battery cell associated therewith a predetermined criterion voltage. A plurality of detection units operate sequentially in response to a start trigger and also sequentially transmit a signal that reflects a result of comparing the voltages to detect whether a battery pack has a low cell voltage fault. A fault monitoring device detects an internal resistance fault when it receives from a transmission circuit a determination signal indicating that the battery pack when electrically discharged has any of its battery cells outputting a voltage decreased to be lower than the criterion voltage and if a current detected has a value smaller in magnitude than a criterion current corresponding to a value of a current obtained by dividing a difference in voltage between an open circuit voltage of the battery cell and the criterion voltage by an upper limit value for internal resistance.

8 Claims, 8 Drawing Sheets

(56) References Cited

FOREIGN PATENT DOCUMENTS

| JP | 2001-307782 A | 11/2001 |
| JP | 2004-134287 A | 4/2004 |
| WO | WO 2008096771 A1 * | 8/2008 | ............ G01R 31/36 |
| WO | 2008/152782 A1 | 12/2008 |

* cited by examiner

BATTERY PACK FAILURE DETECTION DEVICE

This is a 371 national phase application of PCT/JP2009/071538 filed 25 Dec. 2009, the contents of which are incorporated herein by reference.

TECHNICAL FIELD

The present invention relates to a battery pack failure detection device, and particularly to the technology of detecting an internal resistance fault of a battery cell in a battery pack having a plurality of battery cells connected in series.

BACKGROUND ART

A battery pack having a large number of battery cells (or battery modules) connected in series is generally used. For example, hybrid vehicles, electric vehicles, and the like employ such a battery pack as a power supply for driving a motor.

Japanese Patent Laying-Open No. 2004-134287 (PTL 1) discloses a failure detection device for such a battery pack. This failure detection device detects whether a battery pack having a plurality of series connected battery cells or a battery pack having a plurality of series connected sets of cell parallel circuits each having a plurality of parallel connected battery cells is electrically overcharged or overdischarged, and the battery pack's internal resistance is estimated and in accordance therewith an overcharge threshold value and an overdischarge threshold value are modified. When a battery cell or a cell parallel circuit has voltage thereacross exceeding the overcharge threshold value, an overcharge detection signal is issued, whereas when a battery cell or a cell parallel circuit has voltage thereacross below the overdischarge threshold value, an overdischarge detection signal is issued.

The failure detection device allowing a battery packs internal resistance to be estimated and an overcharge threshold value and an overdischarge threshold value to be modified in accordance therewith is believed to ensure that whether the battery pack fails can be detected early (see PTL 1).

CITATION LIST

Patent Literature

PTL 1: Japanese Patent Laying-Open No. 2004-134287

SUMMARY OF INVENTION

Technical Problem

However, the failure detection device described in Japanese Patent Laying-Open No. 2004-134287 detects overcharging or overdischarging for each battery cell and transmits the resultant detection for each battery cell to a control circuit, and thus invites an increased circuit scale and an increased cost. Furthermore, while the failure detection device allows a battery pack's internal resistance to be estimated and an overcharge threshold value and an overdischarge threshold value to be modified in accordance therewith, the document does not discuss internal resistance estimation accuracy or failure detection accuracy.

The present invention has been made to solve such a problem, and it contemplates a battery pack failure detection device that can achieve low cost and also detect an internal resistance fault accurately.

Solution to Problem

The present invention provides a failure detection device for a battery pack having a plurality of battery cells connected in series, including: a plurality of detection units, a current detector and a fault monitoring device. The plurality of detection units are associated with the plurality of battery cells, respectively, and each configured to compare a voltage output from a battery cell associated therewith a predetermined criterion voltage. The current detector is provided to detect a current of the plurality of battery cells. The plurality of detection units are configured to operate sequentially in response to a start trigger and sequentially transmit a signal that reflects a result of comparing the voltages so as to output a fault detection signal indicative of whether the battery back when electrically discharged has any of the battery cells outputting a voltage decreased to be lower than the criterion voltage. The fault monitoring device monitors whether an internal resistance fault has occurred based on the fault detection signal and a value of the current detected by the current detector, the internal resistance fault indicating that any of the battery cells has an internal resistance increasing to be higher than an upper limit value. The fault monitoring device detects the internal resistance fault when the fault detection signal indicates that the battery pack when electrically discharged has any of the battery cells outputting a voltage decreased to be lower than the criterion voltage and if the value of the current detected is smaller in magnitude than a criterion current corresponding to a value of a current obtained by dividing a difference in voltage between an open circuit voltage of the battery cell and the criterion voltage by the upper limit value for the internal resistance.

Preferably, the fault monitoring device monitors whether the internal resistance fault has occurred after the battery pack starts to electrically discharge before a predetermined period of time elapses.

Still preferably, the predetermined period of time is determined based on a voltage drop caused as the battery pack electrically discharges and accordingly polarizes.

Furthermore, the present invention provides a failure detection device for a battery pack having a plurality of battery cells connected in series, including: a plurality of detection units, a current detector and a fault monitoring device. The plurality of detection units are associated with the plurality of battery cells, respectively, and each configured to compare a voltage output from a battery cell associated therewith a predetermined criterion voltage. The current detector is provided to detect a current of the plurality of battery cells. The plurality of detection units are configured to operate sequentially in response to a start trigger and sequentially transmit a signal that reflects a result of comparing the voltages so as to output a fault detection signal indicative of whether the battery back when electrically charged has any of the battery cells outputting a voltage increased to be higher than the criterion voltage. The fault monitoring device monitors whether an internal resistance fault has occurred based on the fault detection signal and a value of the current detected by the current detector, the internal resistance fault indicating that any of the battery cells has an internal resistance increasing to be higher than an upper limit value. The fault monitoring device detects the internal resistance fault when the fault detection signal indicates that the battery pack when electrically charged has any of the battery cells outputting a voltage increased to be higher than the criterion voltage and if the value of the current detected is smaller in magnitude than a criterion current corresponding to a value of a current obtained by dividing a difference in voltage between the criterion voltage and an open circuit voltage of the battery cell by the upper limit value for the internal resistance.

Preferably, the fault monitoring device monitors whether the internal resistance fault has occurred after electrically charging the battery pack is started before a predetermined period of time elapses.

Still preferably, the predetermined period of time is determined based on an increase in voltage caused as the battery pack is electrically charged and accordingly polarizes.

Preferably, the fault monitoring device periodically issues the start trigger to the plurality of detection units and counts how many times the internal resistance fault is detected and once the fault monitoring device has counted a value exceeding a predetermined value the fault monitoring device finalizes that the internal resistance is faulty.

Preferably, the plurality of detection units include first to n-th detection units, n being an integer equal to or greater than 2. The first detection unit operates in response to the start trigger to transmit a signal to a second detection unit of the plurality of detection units to indicate whether a first battery cell is decreased in voltage to be lower than the criterion voltage. An i-th detection unit of the plurality of detection units, with i representing an integer of 2 to n, has a voltage comparator and a logic operation circuit. The voltage comparator is provided to output a result of comparing a voltage output from an i-th battery cell with the criterion voltage. The logic operation circuit is configured to output the signal, based on the signal that is transmitted from an (i−1)th detection unit and a signal output from the voltage comparator, to indicate whether any of the first to i-th battery cells outputs a voltage decreased to be lower than the criterion voltage. The failure detection device further includes a signal transmission circuit to receive the signal from the n-th detection unit and output the fault detection signal in accordance therewith to the fault monitoring device.

Advantageous Effects of Invention

The present invention can provide a battery pack failure detection device that can achieve low cost and also detect an internal resistance fault accurately.

DESCRIPTION OF EMBODIMENTS

Hereinafter, the present invention in embodiments will be described in detail with reference to the drawings. In the figures, identical or corresponding components are identically denoted and will not be described repeatedly in detail.

First Embodiment

Figure 1:
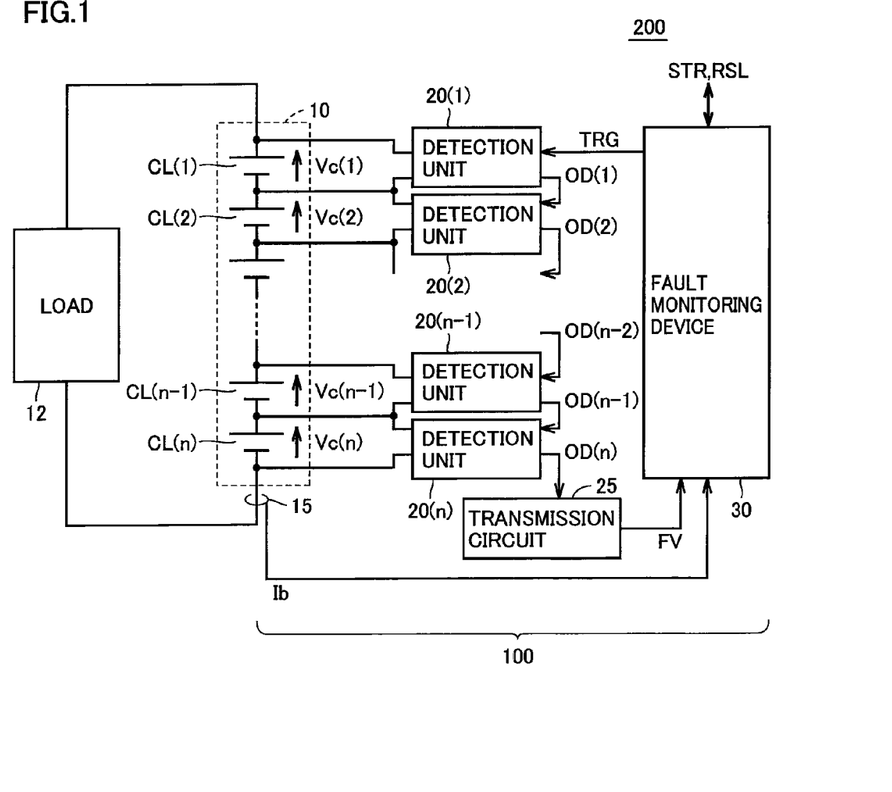
FIG. 1 is a block diagram schematically showing a configuration of a battery pack failure detection device according to a first embodiment of the present invention and an electric system having the same applied thereto.

FIG. 1 is a block diagram schematically showing a configuration of a battery pack failure detection device according to a first embodiment of the present invention and an electric system having the same applied thereto.

Referring to FIG. 1, an electric system 200 is installed on a vehicle, such as a hybrid vehicle or an electric vehicle, that has a mechanism capable of generating force from electric power to drive the vehicle. Electric system 200 includes a battery pack 10, a device 100 to detect whether battery pack 10 fails, and a load 12.

Battery pack 10 is a rechargeable battery, and is represented by a lithium ion battery. Battery pack 10 includes a plurality of battery cells $CL(1)$ to $CL(n)$ connected in series, wherein n is an integer equal to or larger than 2. Battery pack 10 supplies direct current electric power to load 12. Battery pack 10 is also electrically charged with direct current electric power supplied from load 12.

Load 12 includes a motor (not shown), and an inverter (not shown) to drive the motor. This motor is configured to generate force by a power running operation to drive a wheel, or to be rotated by the driving force generated by the wheel to generate alternate current electric power through regenerative braking. The motor may be used for starting an engine mounted in a hybrid vehicle, and/or for generating electric power for electrically charging battery pack 10. The inverter (not shown) receives direct current electric power from battery pack 10, converts it to alternate current electric power and supplies it to the motor, or converts alternate current electric power generated by the motor to direct current electric power and supplies it to battery pack 10.

Failure detection device 100 includes detection units $20(1)$ to $20(n)$ associated with battery cells $CL(1)$ to $CL(n)$, respectively, a transmission circuit 25, a fault monitoring device 30, and a current sensor 15.

Detection units $20(1)$ to $20(n)$ receive voltages $Vc(1)$ to $Vc(n)$ output from battery cells $CL(1)$ to $CL(n)$ respectively associated therewith, respectively. Detection unit $20(1)$ operates in response to a start trigger TRG issued from fault monitoring device 30 to compare voltage $Vc(1)$ output from battery cell $CL(1)$ with a predetermined criterion voltage Vx. In accordance with the voltage comparison result, detection unit $20(1)$ outputs a detection signal $OD(1)$. More specifically, if output voltage $Vc(1)$ is decreased to be lower than criterion voltage Vx (i.e., $Vc(1)<Vx$), detection unit $20(1)$ outputs detection signal $OD(1)$ of a logical high level (hereinafter also referred to as "H level"). On the other hand, if output voltage $Vc(1)$ is not lower than criterion voltage Vx (i.e., $Vc(1) \geq Vx$), detection unit $20(1)$ outputs detection signal $OD(1)$ of a logical low level (hereinafter also referred to as "L level").

Detection unit 20(2) operates in response to the preceding detection unit 20(1) outputting detection signal OD(1) to compare voltage Vc(2) output from battery cell CL(2) with criterion voltage Vx. Then, detection unit 20(2) outputs a detection signal OD(2), which is a logical OR of the voltage comparison result obtained at detection unit 20(1) and the voltage comparison result obtained at detection unit 20(2).

Specifically, when detection signal OD(1) has the H level, detection unit 20(2) outputs detection signal OD(2) of the H level even if Vc(2)≥Vx. On the other hand, when detection signal OD(1) has the L level, detection unit 20(2) outputs detection signal OD(2) according to the result of comparing Vc(2) with criterion voltage Vx, i.e., when Vc(2)<Vx, detection unit 20(2) outputs detection signal OD(2) of the H level, whereas when Vc(2)≥Vx, detection unit 20(2) outputs detection signal OD(2) of the L level.

Figure 2:
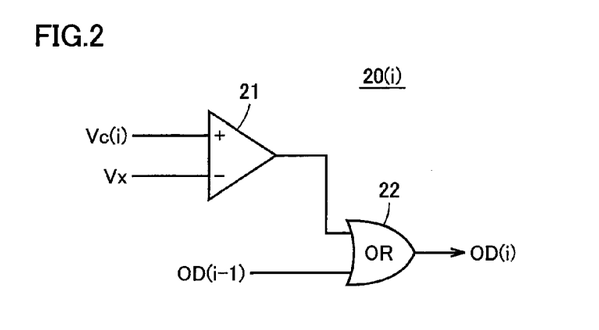
FIG. 2 is a block diagram showing an example in configuration of an i-th detection unit.

FIG. 2 is a block diagram showing an example in configuration of an i-th detection unit 20(i). FIG. 2 shows a configuration of detection unit 20(i), wherein i=2 to n.

Referring to FIG. 2, detection unit 20(i) has a voltage comparator 21 and a logic gate 22. Voltage comparator 21 compares voltage Vc(i) output from battery cell CL(i) associated with detection unit 20(i) with predetermined criterion voltage Vx and outputs voltage set high for Vc(i)<Vx and voltage set low for Vc(i)≥Vx.

Logic gate 22 performs an OR logical operation on a signal output from voltage comparator 21 and a detection signal OD(i−1) received from the preceding detection unit 20(i−1) and outputs the OR as a detection signal OD(i).

Referring again to FIG. 1, each detection unit 20, which generically denotes detection units 20(1) to 20(n), reflects its voltage comparison result in a detection signal OD, which generically denotes detection signals OD(1) to OD(n), and detection signal OD is ORed and thus transmitted to a subsequent detection unit 20 sequentially. As a result, detection units 20(1) to 20(n) operate sequentially in response to start trigger TRG.

Each detection unit 20 has a similar operation time, and as a result, battery cells CL(1) to CL(n) have their output voltages Vc(1) to Vc(n) compared with criterion voltage Vx sequentially in a fixed period. The last detection unit 20(n) outputs a detection signal OD(n), which is obtained through a series of comparisons in voltage done in response to start trigger TRG between battery cells CL(1) to CL(n) and criterion voltage Vx and is indicative of whether any battery cell outputs voltage decreased to be lower than criterion voltage Vx, and it is for example a one-bit digital signal.

Transmission circuit 25 receives detection signal OD(n) from the last detection unit 20(n), and insulates the signal by a photocoupler or the like and therefrom generates a final determination signal FV. Specifically, determination signal FV is generated in response to start trigger TRG and transmitted to fault monitoring device 30. As has been described above, determination signal FV indicates whether any of battery cells CL(1) to CL(n) outputs voltage decreased to be lower than criterion voltage Vx (herein after also referred to as a "low cell voltage fault"). More specifically, if any of battery cells CL(1) to CL(n) outputs voltage decreased to be lower than criterion voltage Vx, determination signal FV is set high. If none of battery cells CL(1) to CL(n) outputs voltage lower than criterion voltage Vx, determination signal FV is set low.

Current sensor 15 senses a battery current Ib passing through battery pack 10. Since battery cells CL(1) to CL(n) are connected in series, battery current Ib is common to battery cells CL(1) to CL(n). Current sensor 15 allows the value of battery current Ib to be obtained. On the other hand, failure detection device 100 is not provided with a voltage sensor for sensing a value in voltage of voltages Vc(1) to Vc(n) output from battery cells CL(1) to CL(n), and only handles a result of comparison in voltage with criterion voltage Vx. It will thus be understood that failure detection device 100 does not include a voltage sensor for sensing (analog) values in voltage of a large number of battery cells CL(1) to CL(n) in connection with monitoring each battery cell in voltage. Note that, as one example, current sensor 15 senses as a positive value a current flowing when battery pack 10 electrically discharges, and current sensor 15 senses as a negative value a current flowing when battery pack 10 is electrically charged.

Fault monitoring device 30 operates in response to a start indication signal STR received from an upper electronic control unit (ECU) to perform an operation to detect whether battery cells CL(1) to CL(n) are defective. That is, fault monitoring device 30 operates in response to start indication signal STR to issue start trigger TRG to detection unit 20(1).

Then, fault monitoring device 30 receives determination signal FV returned in response to start trigger TRG and a value of a current sensed by current sensor 15, and therefrom determines in a method, as will be described hereinafter, whether a low cell voltage fault has occurred, and if so, then determines whether excessively increased internal resistance (hereinafter also referred to as an "internal resistance fault") has occurred.

Fault monitoring device 30 issues start trigger TRG periodically. That is, fault monitoring device 30 periodically determines whether an internal resistance fault has occurred. Furthermore, fault monitoring device 30 counts how many times the internal resistance fault is detected, and when fault monitoring device 30 counts the internal resistance fault more often than predetermined, fault monitoring device 30 finalizes the internal resistance fault.

Then, fault monitoring device 30 outputs to the upper ECU a signal RSL indicating a resultantly detected fault of battery cells CL(1) to CL(n) (at least including a low cell voltage fault and an internal resistance fault).

Fault monitoring device 30 detects an internal resistance fault, as will be described hereinafter more specifically. Fault monitoring device 30 can be configured as a microcomputer, such as an integrated circuit (IC), and is configured to perform a fault detection operation, as will be described hereinafter, through software processing implemented by executing a previously stored program(s) and/or hardware processing implemented by a dedicated electronic circuit (not shown) prepared in advance.

Figure 3:
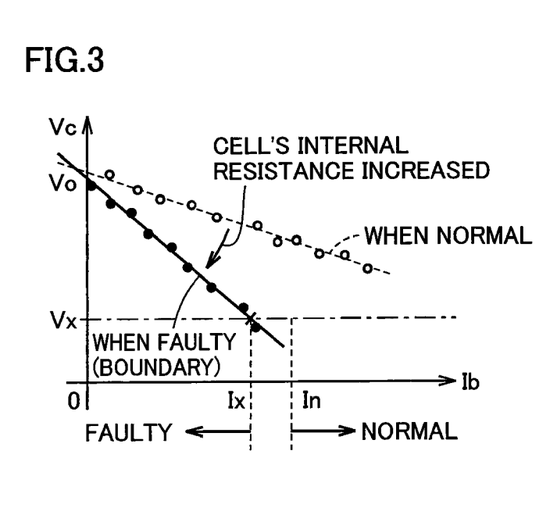
FIG. 3 is a conceptual view for illustrating a technique of detecting an internal resistance fault by a fault monitoring device.

FIG. 3 is a conceptual view for illustrating a technique of detecting an internal resistance fault by fault monitoring device 30.

Referring to FIG. 3, a battery cell's internal resistance can be detected by observing a voltage drop from an open-circuit voltage Vo that is caused by battery current Ib. Specifically, as battery current Ib increases, the battery cell will output voltage Vc decreasing along a slope corresponding to the internal resistance.

When a battery cell has an increased internal resistance, an Ib-Vc line indicated in FIG. 3 has a slope, which has a negative value, steepened, and output voltage Vc will be decreased for the same battery current Ib. By determining an internal resistance boundary value corresponding to a threshold value used in detecting an internal resistance fault, a current Ix that appears when output voltage Vc is equal to Vx with the internal resistance equal to the boundary value can be obtained. Specifically, a difference in voltage between open circuit voltage Vo and criterion voltage Vx can be divided by the internal resistance boundary value (an upper limit value)

to calculate current Ix that appears when output voltage Vc is equal to Vx with the internal resistance equal to the boundary value.

Current Ix thus obtained can be compared with battery current Ib that appears when any of battery cells CL(1) to CL(n) outputs voltage below criterion voltage Vx to serve as a criterion current used to detect an internal resistance fault. Specifically, when a low cell voltage fault is detected, and battery current Ib<Ix, that an internal resistance fault has occurred is detected, whereas when a low cell voltage fault is detected, and Ib≥Ix, that there is no internal resistance fault is detected, so that failure detection device 100 without a voltage sensor for obtaining a value in voltage output from each battery cell can perform a failure detection operation to determine whether any internal resistance fault is present or absent.

Note that comparing battery current Ib with criterion current Ix to determine whether any internal resistance fault is present or absent requires comparing battery current Ib that appears exactly when a low cell voltage fault has occurred with criterion current Ix, and battery current Ib to be compared with criterion current Ix is sampled for example by fault monitoring device 30, which receives a value output from current sensor 15, as timed to coincide with when fault monitoring device 30 receives determination signal FV from transmission circuit 25.

Note that current In (>Ix) shown in FIG. 3 is a criterion current for determining that the internal resistance is normal, and when battery current Ib is larger than current In, it is determined that the internal resistance is normal. Note that In>Ix is set in order to prevent a resultant determination from chattering when battery current Ib is around current Ix.

Figure 4:
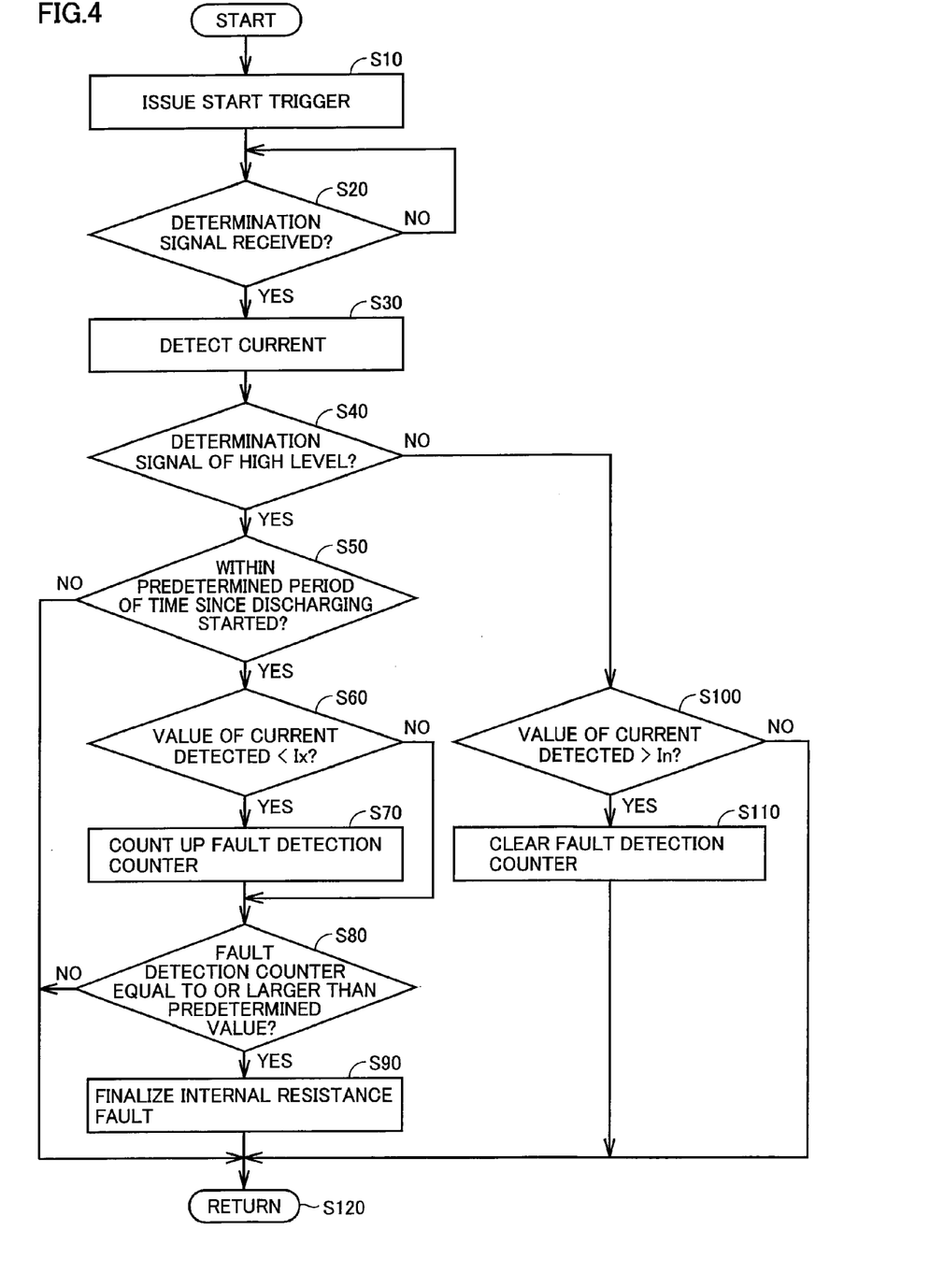
FIG. 4 is a flowchart for illustrating a procedure to detect an internal resistance fault, as performed by the fault monitoring device shown in FIG. 1.

FIG. 4 is a flowchart for illustrating a procedure to detect an internal resistance fault, as performed by fault monitoring device 30 shown in FIG. 1. Note that the flowchart indicates a series of steps, which are performed periodically.

With reference to FIG. 4, fault monitoring device 30 issues start trigger TRG to detection unit 20(1) (Step S10). In response to start trigger TRG, detection units 20(1) to 20(n) operate sequentially, as has been described in FIG. 1. Voltage output from each battery cell CL(1) to CL(n) is compared with criterion voltage Vx, and after detection unit 20(n) completes comparing the voltages, determination signal FV reaches fault monitoring device 30 via transmission circuit 25.

After the start trigger is issued, fault monitoring device 30 determines whether determination signal FV has been received from transmission circuit 25 (Step S20). If so (YES in step S20), fault monitoring device 30 samples a value output from current sensor 15 and detects battery current Ib (Step S30).

Subsequently, fault monitoring device 30 determines whether determination signal FV received has the H level (Step S40). If so (YES in Step S40), fault monitoring device 30 determines whether it is within a predetermined period of time since battery pack 10 started to electrically discharge (Step S50). If the predetermined period of time has elapsed since battery pack 10 started to electrically discharge (NO in Step S50), fault monitoring device 30 avoids determining whether there is any internal resistance fault found, and instead proceeds to Step S120.

Once the predetermined period of time has elapsed since battery pack 10 started to electrically discharge, determining whether there is any internal resistance fault found is avoided, since battery pack 10 polarizes, which leads to an erroneous determination that an internal resistance fault has occurred.

Hereinafter, how an internal resistance fault is erroneously determined due to the effect of the polarization.

Figure 5:
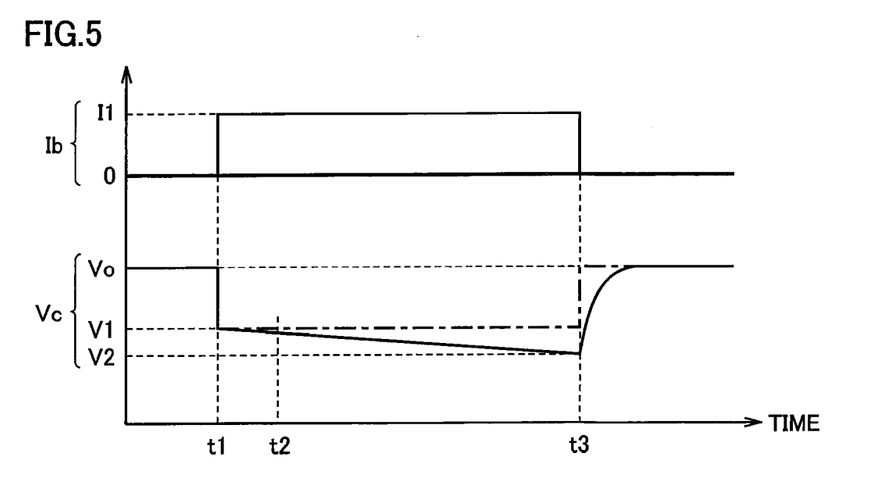
FIG. 5 shows how a battery's current and a battery cell's output voltage vary with time.

FIG. 5 shows how battery current Ib and voltage Vc output from battery cell CL vary with time. With reference to FIG. 5, battery current Ib of a constant value I1 flows from time t1 to time t3, for the sake of illustration. At time t1, output voltage Vc decreases from open circuit voltage Vo to voltage V1. The voltage drops by an amount determined by the internal resistance of battery cell CL and the magnitude of current Ib (i.e., I1). However, while battery current Ib is constant, output voltage Vc decreases gradually from V1 as battery cell CL polarizes, and output voltage Vc decreases to V2 when the battery finishes electrically discharging, i.e., at time t3.

Figure 6:
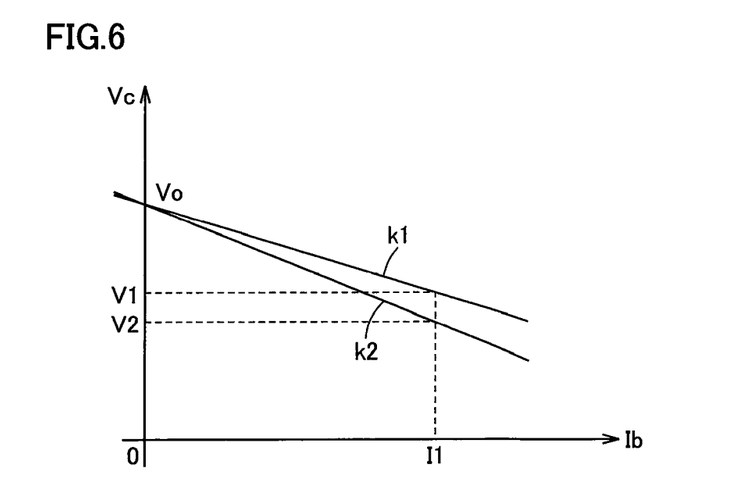
FIG. 6 shows a relationship between a battery's current and a battery cell's output voltage.

FIG. 6 shows a relationship between battery current Ib and voltage Vc output from battery cell CL. With reference to FIG. 6, voltages V1, V2, and current I1 correspond to those of FIG. 5. While internal resistance is accurately represented by a slope of a straight line k1 connecting open circuit voltage Vo and voltage V1 appearing when battery current Ib is I1, the polarization's effect leads to such an erroneous estimation that the internal resistance is represented by a slope of a straight line k2. In other words, the polarization's effect leads to excessively estimated internal resistance, and as a result, while in reality the internal resistance is within a normal range, it is erroneously determined as an internal resistance fault.

Accordingly, in the first embodiment, whether any internal resistance fault has occurred is determined only for a period in which the effect of a drop in voltage caused when battery pack 10 polarizes as it is electrically discharged is neglectable, and once a predetermined period of time (for example of 1 second) has elapsed since battery pack 10 started to electrically discharge (e.g., after time t2 of FIG. 5), determining whether any internal resistance fault has occurred is avoided.

With reference again to FIG. 4, if in Step S50 fault monitoring device 30 determines that it is within the predetermined period of time since battery pack 10 started to electrically discharge (YES in Step S50), fault monitoring device 30 determines whether the current sensed that is sampled in Step S30 has a value smaller than criterion current Ix (Step S60). If so (YES in Step S60), fault monitoring device 30 counts up a fault detection counter (Step S70). If it is determined that the current sensed has a value equal to or larger than criterion current Ix (NO in Step S60), fault monitoring device 30 proceeds to Step S80.

Subsequently, fault monitoring device 30 determines whether the fault detection counter has counted a predetermined value or larger (Step S80). If so (YES in Step S80), fault monitoring device 30 finalizes that the internal resistance is faulty (Step S90).

If in Step S40 it is determined that determination signal FV received from transmission circuit 25 does not have the H level (or has the L level) (NO in Step S40), fault monitoring device 30 determines whether the current sensed that is sampled in Step S30 has a value larger than criterion current In (Step S100). If so (YES in Step S100), it is determined that the internal resistance is normal, and fault monitoring device 30 clears the fault detection counter to 0 (Step S110).

Figure 7:
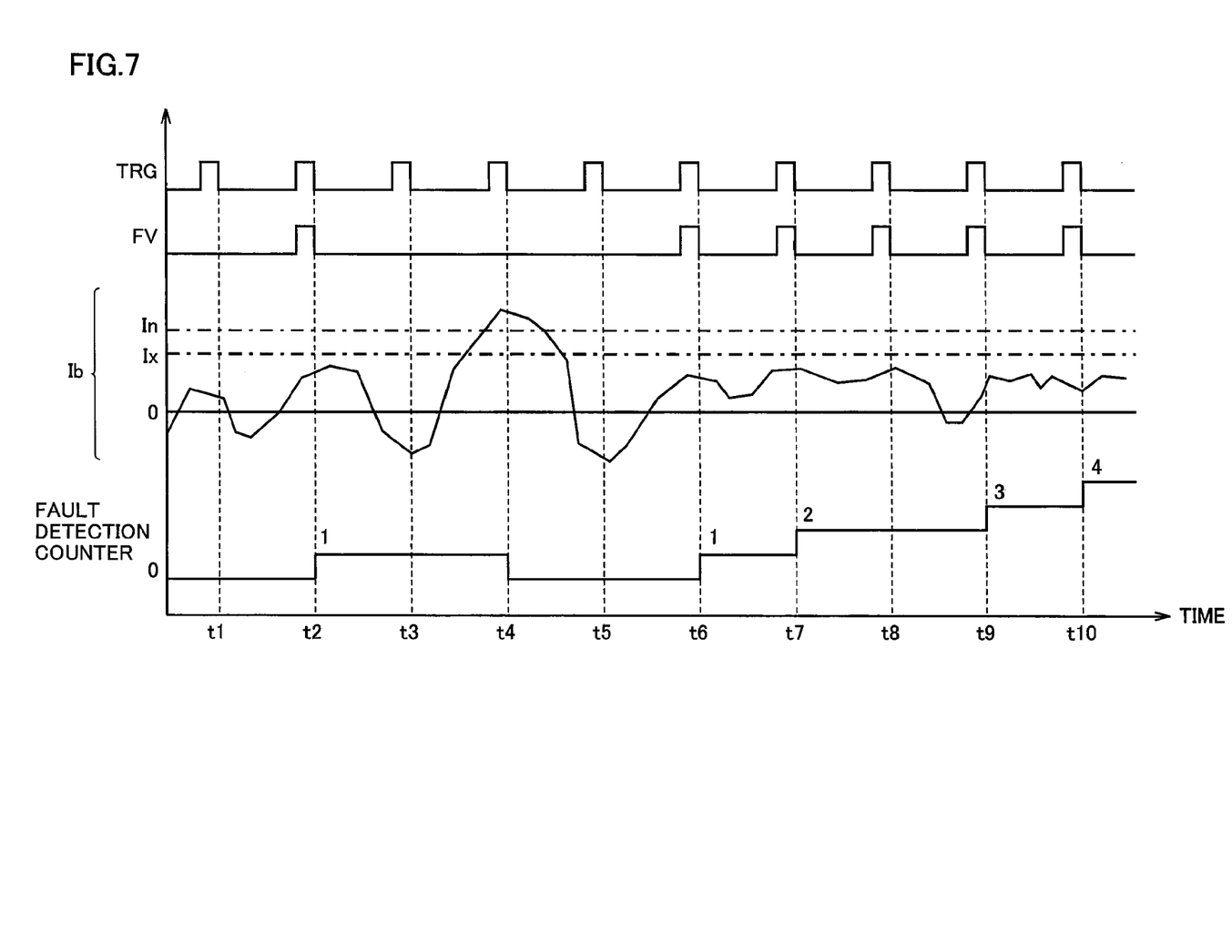
FIG. 7 is timing plots of main signals.

FIG. 7 is timing plots of main signals. With reference to FIG. 7, start trigger TRG is issued periodically (time t1 to time t10). At time t1, determination signal FV indicating whether any low cell voltage fault has occurred has the L level, and accordingly, while battery current Ib is smaller than criterion current Ix, the fault detection counter does not count up.

At time t2, determination signal FV has the H level, and battery current Ib is smaller than criterion current Ix, and accordingly, the fault detection counter counts up. At time t3, determination signal FV has the L level, and accordingly, the fault detection counter does not count up and is maintained at the immediately previous value (1).

At time t4, battery current Ib exceeds criterion current In for determining that the internal resistance is normal, and accordingly, the fault detection counter is cleared to 0. At time t6, determination signal FV has the H level, and battery current Ib is smaller than criterion current Ix, and accordingly, the fault detection counter again counts up. Similarly, at time t7, the fault detection counter further counts up.

At time t8, while determination signal FV has the H level and battery current Ib is smaller than criterion current Ix, a predetermined period of time (for example of 1 second) has elapsed since battery pack 10 started to electrically discharge, and accordingly, the fault detection counter does not count up and is maintained at the immediately previous value (2).

At time t9, determination signal FV has the H level and battery current Ib is smaller than criterion current Ix, and accordingly, the fault detection counter again counts up, and similarly, the fault detection counter also further counts up at time t10. Then, at time t10, it is determined that the fault detection counter has counted the predetermined value or larger, and at this point in time, it is finalized that the internal resistance is faulty.

Thus in the first embodiment it is not necessary to provide a voltage sensor for each battery cell and there is no signal transmitted from each detection unit except that of the last stage to fault monitoring device 30, either, and a reduced circuit scale can thus be achieved. Furthermore, when a low cell voltage fault is detected, battery current Ib and criterion current Ix are used to detect whether an internal resistance fault has occurred, and whether the internal resistance fault has occurred can thus be detected more accurately. The first embodiment can thus provide a battery pack failure detection device that can achieve low cost and also detect an internal resistance fault accurately.

Furthermore, as battery pack 10 electrically discharges, it polarizes, and accordingly, in the first embodiment, whether an internal resistance fault has occurred is monitored only after battery pack 10 starts to electrically discharge before a predetermined period of time elapses. Accordingly, in the first embodiment, the effect of the polarization can be excluded and whether an internal resistance fault has occurred can be detected more accurately.

Furthermore, in the first embodiment, start trigger TRG is issued periodically. Furthermore, how many times an internal resistance fault is detected is counted by a fault detection counter, and once the fault detection counter has counted a value exceeding a predetermined value, it is finalized that the internal resistance is faulty. Thus, in the first embodiment, erroneously determining that an internal resistance fault has occurred can be prevented.

Second Embodiment

In the first embodiment, detection unit 20 detects whether any of battery cells CL(1) to CL(n) outputs voltage decreased to be lower than criterion voltage Vx, i.e., a low cell voltage fault. That is, in the first embodiment, whether an internal resistance fault has occurred is detected when battery pack 10 electrically discharges, whereas in the second embodiment a technique will be described to detect whether any internal resistance fault has occurred when battery pack 10 is electrically charged.

With reference again to FIG. 1, the second embodiment provides a battery pack failure detection device and electric system having the detection device applied thereto, in a configuration generally identical to that of the first embodiment shown in FIG. 1. In the second embodiment, if output voltage Vc(1) exceeds criterion voltage Vx (i.e., Vc(1)>Vx), detection unit 20(1) outputs detection signal OD(1) of the H level. In contrast, if output voltage Vc(1) does not exceed criterion voltage Vx (i.e., Vc(1)≤Vx), detection unit 20(1) outputs detection signal OD(1) of the L level.

When detection signal OD(1) has the H level, detection unit 20(2) outputs detection signal OD(2) of the H level even if Vc(2)≤Vx. On the other hand, when detection signal OD(1) has the L level, detection unit 20(2) follows a result of comparing Vc(2) with criterion voltage Vx, i.e., for Vc(2)>Vx, detection signal OD(2) of the H level is output, whereas for Vc(2)≤Vx, detection signal OD(2) of the L level is output.

Figure 8:
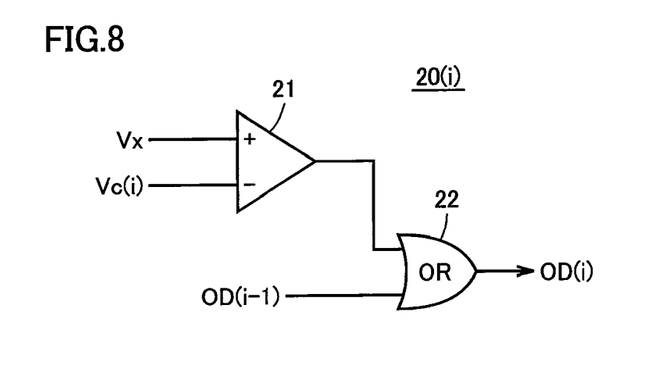
FIG. 8 is a block diagram showing an example in configuration of an i-th detection unit in a second embodiment.

FIG. 8 is a block diagram showing an example in configuration of the i-th detection unit 20(i) in the second embodiment. FIG. 8 shows a configuration of detection unit 20(i), wherein i=2 to n.

With reference to FIG. 8, in the second embodiment, voltage comparator 21 compares voltage Vc(i) output from battery cell CL(i) associated with detection unit 20(i) with criterion voltage Vx predetermined, and for Vx<Vc(i), voltage comparator 21 outputs voltage set high, whereas for Vx≥Vc(i), voltage comparator 21 outputs voltage set low.

Logic gate 22 performs an OR logical operation on a signal output from voltage comparator 21 and detection signal OD(i-1) received from the preceding detection unit 20(i-1) and outputs the OR as detection signal OD(i) of detection unit 20(i).

With reference again to FIG. 1, as has been set forth above, each detection unit 20 reflects its voltage comparison result in detection signal OD, which is ORed and transmitted to a subsequent detection unit 20. As a result, detection units 20(1) to 20(n) operate sequentially in response to start trigger TRG. Then, the last detection unit 20(n) outputs detection signal OD(n), which is obtained through a series of comparisons in voltage done in response to start trigger TRG between battery cells CL(1) to CL(n) and criterion voltage Vx and is indicative of whether any battery cell outputs voltage increased to be higher than criterion voltage Vx.

Based on detection signal OD(n) output from the last detection unit 20(n), transmission circuit 25 generates determination signal FV. Determination signal FV indicates whether any of battery cells CL(1) to CL(n) outputs voltage increased to be higher than criterion voltage Vx (hereinafter also referred to as a "high cell voltage fault"). More specifically, if any of battery cells CL(1) to CL(n) outputs voltage increased to be higher than criterion voltage Vx, determination signal FV is set high. If none of battery cells CL(1) to CL(n) outputs voltage higher than criterion voltage Vx, determination signal FV is set low.

Then, fault monitoring device 30 receives determination signal FV returned in response to start trigger TRG and a value of a current sensed by current sensor 15, and therefrom determines in a method, as will be described hereinafter, whether a high cell voltage fault has occurred, and if so, then determines whether an internal resistance fault has occurred.

Figure 9:
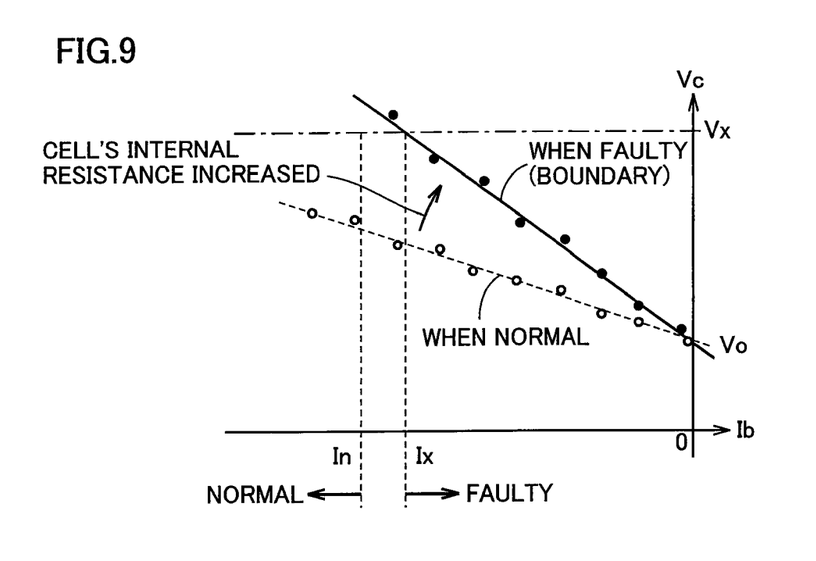
FIG. 9 is a conceptual view for illustrating a technique of detecting an internal resistance fault when a battery pack is electrically charged.

FIG. 9 is a conceptual view for illustrating a technique of detecting an internal resistance fault when battery pack 10 is electrically charged.

Referring to FIG. 9, when battery pack 10 is electrically charged, a battery cell's internal resistance can be detected by observing an increase in voltage from open-circuit voltage Vo that is caused by battery current Ib (having a negative value when battery pack 10 is electrically charged). Specifically, as battery current Ib increases (negatively), the battery cell will output voltage Vc increasing along a slope corresponding to the internal resistance. As has also been described with reference to FIG. 3, by determining an internal resistance boundary value corresponding to a threshold value used in detecting an internal resistance fault, current Ix that appears when output voltage Vc is equal to Vx with the internal resistance equal to the boundary value can be obtained. Specifically, a difference (of a negative value) in voltage between open circuit voltage Vo and criterion voltage Vx can be divided by an internal resistance boundary value (an upper limit value) to calculate current Ix (of a negative value) that appears when output voltage Vc is equal to Vx with the internal resistance equal to the boundary value.

Current Ix thus obtained can be compared with battery current Ib that appears when any of battery cells CL(1) to CL(n) outputs voltage higher than criterion voltage Vx, to serve as a criterion current used to detect an internal resistance fault. Specifically, when a high cell voltage fault is detected, and battery current Ib>Ix (Ib and Ix both have negative values, respectively), that an internal resistance fault has occurred is detected, whereas when a high cell voltage fault is detected, and Ib≤Ix, that there is no internal resistance fault is detected, so that whether any internal resistance fault is present or absent can be determined.

Note that current In shown in FIG. 3, which also has a negative value and is smaller than Ix, is a criterion current for determining that the internal resistance is normal, and when battery current Ib is smaller than current In (that is, battery current Ib is larger in magnitude than current In), it is determined that the internal resistance is normal. Note that In<Ix is set in order to prevent a resultant determination from chattering when battery current Ib is around current Ix.

Figure 10:
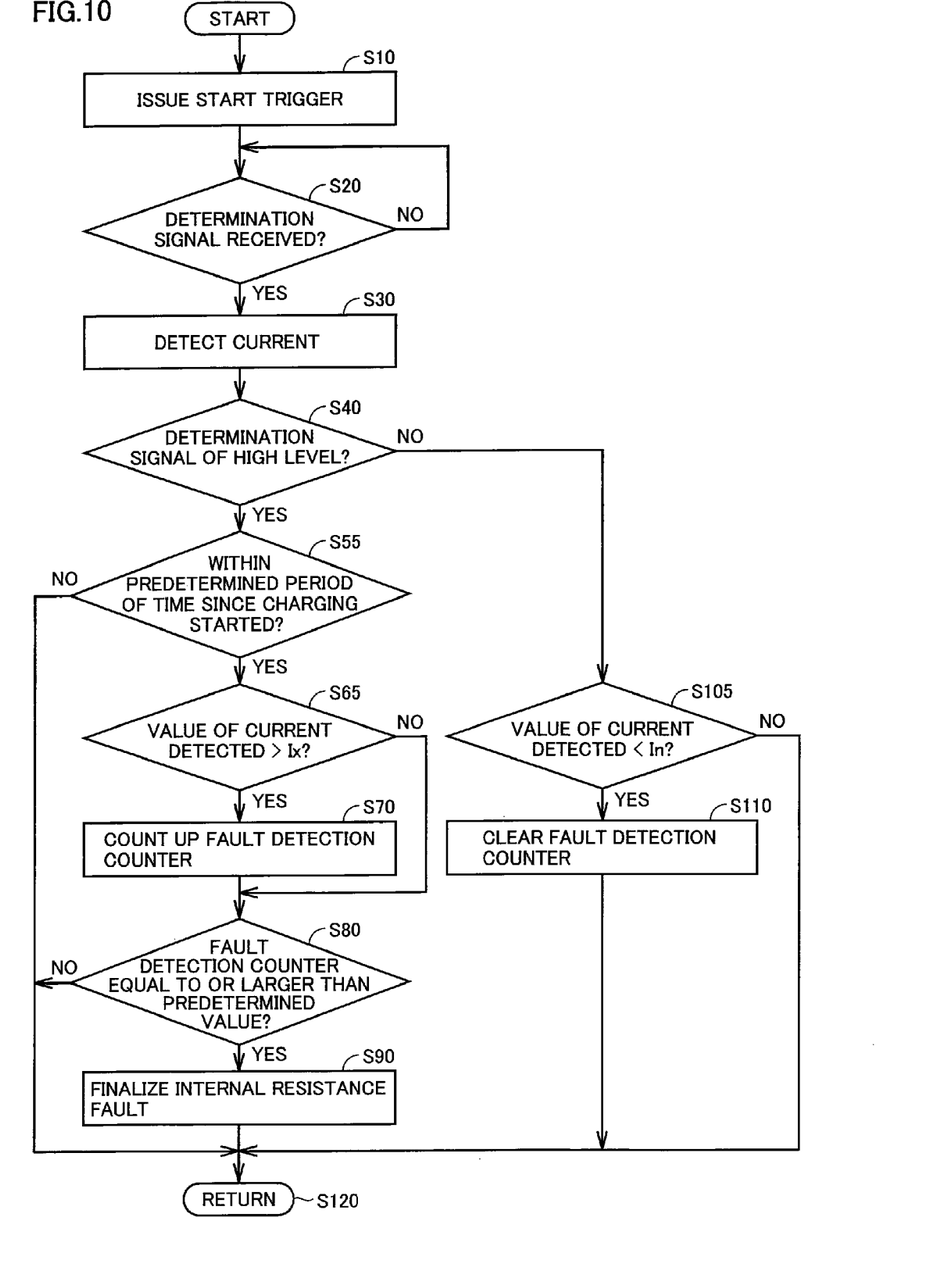
FIG. 10 is a flowchart for illustrating a procedure to detect an internal resistance fault, as performed by a fault monitoring device in the second embodiment.

FIG. 10 is a flowchart for illustrating a procedure to detect an internal resistance fault, as performed by fault monitoring device 30 in the second embodiment. Note that the flowchart indicates a series of steps, which are also performed periodically.

With reference to FIG. 10, this flowchart corresponds to the FIG. 4 flowchart having Steps S50, S60, and S100 replaced with Steps S55, S65, and S105, respectively. That is, if it is determined in Step S40 that determination signal FV has the H level (YES in Step S40), fault monitoring device 30 determines whether it is within a predetermined period of time since electrically charging battery pack 10 was started (Step S55). If not (NO in Step S55), fault monitoring device 30 does not determine whether any internal resistance fault has occurred, and fault monitoring device 30 instead proceeds to Step S120.

If in Step S55 fault monitoring device 30 determines that it is within the predetermined period of time since electrically charging battery pack 10 was started, (YES in Step S55), fault monitoring device 30 determines whether the current sensed that is sampled in Step S30 has a (negative) value larger than criterion current Ix (of a negative value) (Step S65). If so (YES in Step S65), the control proceeds to Step S70 and the fault detection counter counts up.

If in Step S40 it is determined that determination signal FV received from transmission circuit 25 does not have the H level (or has the L level) (NO in Step S40), fault monitoring device 30 determines whether the current sensed that is sampled in Step S30 has a (negative) value smaller than criterion current In (of a negative value) (Step S105). If so (YES in Step S105), it is determined that the internal resistance is normal, and the control proceeds to Step S110 and the fault detection counter is cleared to zero.

Note that, as has been described above, the second embodiment is also provided such that once a predetermined period of time has elapsed since electrically charging battery pack 10 was started, determining whether any internal resistance fault has occurred is avoided to prevent erroneously determining that an internal resistance fault has occurred, as battery pack 10 polarizes. That is, when battery pack 10 is electrically charged, it polarizes and accordingly, rises in voltage, and accordingly, the second embodiment is also provided such that whether any internal resistance fault has occurred is determined only for a period in which an effect of an increase in voltage caused as battery pack 10 polarizes as it is electrically charged is neglectable, and once a predetermined period of time (for example of 1 second) has elapsed since electrically charging battery pack 10 was started, determining whether any internal resistance fault has occurred is avoided.

Thus, the second embodiment can also provide the same effect as the first embodiment. Note that it is a matter of course that the first embodiment and the second embodiment can be combined to detect whether any internal resistance fault has occurred both when battery pack 10 is electrically discharged and when battery pack 10 is electrically charged.

Exemplary Variation

In this exemplary variation whether battery pack 10 has an internal resistance fault is detected in a method per se identical to those in the first embodiment and the second embodiment, except that the internal resistance fault is finalized via a fault detection counter in a method different than the first embodiment and the second embodiment. Specifically, in this exemplary variation, how many times the fault is detected for a predetermined period of time is accumulated (i.e., a fault detection counter 1 described hereinafter), and if the cumulative value exceeds a predetermined value, a fault detection counter (i.e., a fault detection counter 2 described hereinafter) counts up. When the fault detection counter reaches a predetermined value, the internal resistance fault is finalized.

Figure 11:
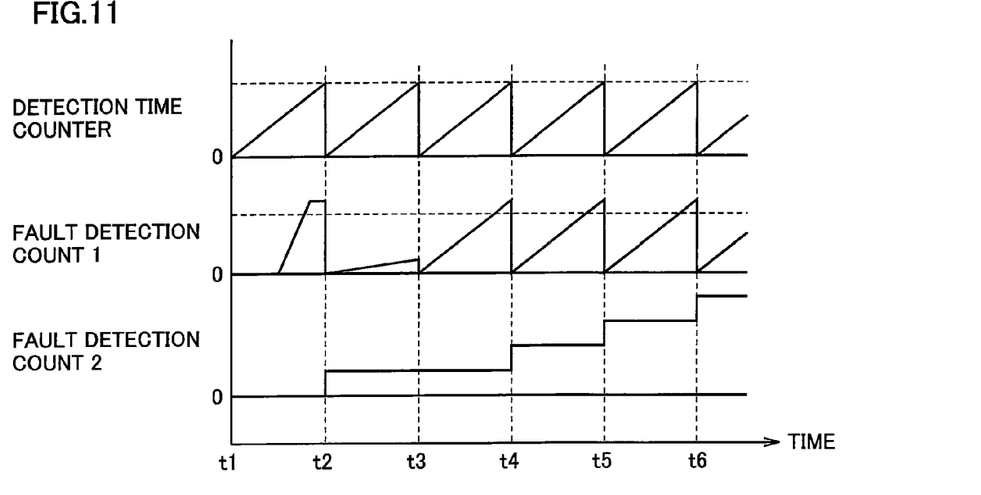
FIG. 11 is timing plots for illustrating a method to finalize an internal resistance fault in an exemplary variation.

FIG. 11 is timing plots for illustrating a method to finalize an internal resistance fault in the exemplary variation. With reference to FIG. 11, the exemplary variation also employs a method similar to the first embodiment and the second embodiment to determine whether any internal resistance fault is present or absent. If the battery when electrically discharged has a low cell voltage fault or the battery when electrically charged has a high cell voltage fault, and a current sensed has a value smaller in magnitude than criterion current Ix, fault detection counter 1 counts up.

When a detection time counter for determining a timing for processing reaches a predetermined value, and if fault detection counter 1 exceeds a predetermined value, fault detection counter 2 counts up. If fault detection counter 1 is smaller than the predetermined value, fault detection counter 2 is maintained. Thereafter, the detection time counter and fault detection counter 1 are cleared to 0, and the detection time counter resumes counting up.

Such a process as above is performed whenever the detection time counter reaches the predetermined value, and when fault detection counter 2 reaches a predetermined value, an internal resistance fault is finalized.

In FIG. 11, an internal resistance fault is detected between time t1 and time t2, and fault detection counter 1 counts up. When the detection time counter reaches the predetermined value i.e., at time t2, fault detection counter 1 has exceeded the predetermined value, and accordingly, fault detection counter 2 counts up.

From time t2 to the next timing for processing, i.e., to time t3, the fault is detected less frequently, and at time t3, fault detection counter 1 does not exceed the predetermined value, and accordingly, fault detection counter 2 is held at the immediately previous value. At subsequent timings for processing, i.e., at times t4, t5, and t6, fault detection counter 1 exceeds the predetermined value, and accordingly, fault detection counter 2 counts up successively, and for example if at time t6 it is determined that fault detection counter 2 has reached the predetermined value, the internal resistance fault is finalized.

Thus in this exemplary variation a two-stage fault detection counter is provided to ensure preventing an erroneous determination made toward finalizing an internal resistance fault.

Figure 12:
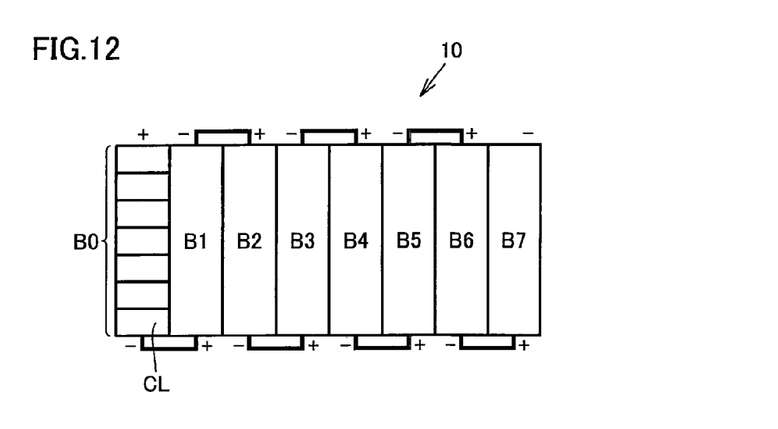
FIG. 12 is a block diagram showing another example in configuration of the battery pack to which the battery pack failure detection device is applied.

Note that as shown in FIG. 12, the FIG. 1 battery pack 10 may be used as a single battery block, and a plurality of such battery blocks (B0 to B7) may be combined together to configure battery pack 10.

It should be understood that the embodiments disclosed herein are illustrative and non-restrictive in any respect. The scope of the present invention is defined by the terms of the claims, rather than the description above, and is intended to include any modifications within the scope and meaning equivalent to the terms of the claims.

REFERENCE SIGNS LIST

10: battery pack; 12: load; 15: current sensor; 20(1) to 20(n): detection unit; 21: voltage comparator; 22: logic gate; 25: transmission circuit; 30: fault monitoring device; 100: failure detection device; 200: electric system; CL(1) to CL(n): battery cell; B0 to B7: battery block.

The invention claimed is:

1. A failure detection device for a battery pack having a plurality of battery cells connected in series, comprising:
    a plurality of detection units associated with said plurality of battery cells, respectively, and each configured to compare a voltage output from a battery cell associated therewith with a predetermined criterion voltage;
    a current detector for detecting a current of said plurality of battery cells,
    said plurality of detection units operating sequentially in response to a start trigger and sequentially transmitting a signal that reflects a result of comparing said voltages so as to output a fault detection signal indicative of whether said battery back when electrically discharged has any of said battery cells outputting a voltage decreased to be lower than said criterion voltage; and
    a fault monitoring device monitoring whether an internal resistance fault has occurred based on said fault detection signal and a value of said current detected by said current detector, said internal resistance fault indicating that any of said battery cells has an internal resistance increasing to be higher than an upper limit value,
    said fault monitoring device detecting said internal resistance fault when said fault detection signal indicates that said battery pack when electrically discharged has any of said battery cells outputting a voltage decreased to be lower than said criterion voltage and if said value of said current detected is smaller in magnitude than a criterion current corresponding to a value of a current obtained by dividing a difference in voltage between an open circuit voltage of said battery cell and said criterion voltage by said upper limit value for said internal resistance.

2. The failure detection device for a battery pack according to claim 1, wherein said fault monitoring device monitors whether said internal resistance fault has occurred after said battery pack starts to electrically discharge before a predetermined period of time elapses.

3. The failure detection device for a battery pack according to claim 2, wherein said predetermined period of time is determined based on a voltage drop caused as said battery pack electrically discharges and accordingly polarizes.

4. A failure detection device for a battery pack having a plurality of battery cells connected in series, comprising:
    a plurality of detection units associated with said plurality of battery cells, respectively, and each configured to compare a voltage output from a battery cell associated therewith with a predetermined criterion voltage;
    a current detector for detecting a current of said plurality of battery cells,
    said plurality of detection units operating sequentially in response to a start trigger and sequentially transmitting a signal that reflects a result of comparing said voltages so as to output a fault detection signal indicative of whether said battery back when electrically charged has any of said battery cells outputting a voltage increased to be higher than said criterion voltage; and
    a fault monitoring device monitoring whether an internal resistance fault has occurred based on said fault detection signal and a value of said current detected by said current detector, said internal resistance fault indicating that any of said battery cells has an internal resistance increasing to be higher than an upper limit value,
    said fault monitoring device detecting said internal resistance fault when said fault detection signal indicates that said battery pack when electrically charged has any of said battery cells outputting a voltage increased to be higher than said criterion voltage and if said value of said current detected is smaller in magnitude than a criterion current corresponding to a value of a current obtained by dividing a difference in voltage between said criterion voltage and an open circuit voltage of said battery cell by said upper limit value for said internal resistance.

5. The failure detection device for a battery pack according to claim 4, wherein said fault monitoring device monitors whether said internal resistance fault has occurred after electrically charging said battery pack is started before a predetermined period of time elapses.

6. The failure detection device for a battery pack according to claim 5, wherein said predetermined period of time is determined based on an increase in voltage caused as said battery pack is electrically charged and accordingly polarizes.

7. The failure detection device for a battery pack according to claim 1, wherein said fault monitoring device periodically issues said start trigger to said plurality of detection units and counts how many times said internal resistance fault is detected and once said fault monitoring device has counted a value exceeding a predetermined value said fault monitoring device finalizes that said internal resistance is faulty.

8. The failure detection device for a battery pack according to claim 1, wherein:
    said plurality of detection units include first to n-th detection units, n being an integer equal to or greater than 2;
    said first detection unit operates in response to said start trigger to transmit a signal to a second detection unit of said plurality of detection units to indicate whether a first battery cell is decreased in voltage to be lower than said criterion voltage;
    an i-th detection unit of said plurality of detection units, with i representing an integer of 2 to n, has
        a voltage comparator for outputting a result of comparing a voltage output from an i-th battery cell with said criterion voltage, and
        a logic operation circuit configured to output said signal, based on said signal that is transmitted from an (i−1)th detection unit and a signal output from said voltage comparator, to indicate whether any of said first to i-th battery cells outputs a voltage decreased to be lower than said criterion voltage; and
    the failure detection device further comprises a signal transmission circuit for receiving said signal from said n-th detection unit and outputting said fault detection signal in accordance therewith to said fault monitoring device.

* * * * *